United States Patent [19]

Ohori et al.

[11] Patent Number: 5,686,741

[45] Date of Patent: Nov. 11, 1997

[54] COMPOUND SEMICONDUCTOR DEVICE ON SILICON SUBSTRATE AND METHOD OF MANUFACTURING THE SAME

[75] Inventors: Tatsuya Ohori; Kanae Fukuzawa, both of Kawasaki, Japan

[73] Assignee: Fujitsu, Ltd., Kawasaki, Japan

[21] Appl. No.: 568,405

[22] Filed: Dec. 6, 1995

Related U.S. Application Data

[63] Continuation of Ser. No. 216,325, Mar. 23, 1994, abandoned.

[30] Foreign Application Priority Data

Jun. 18, 1993 [JP] Japan ........................... 5-147473

[51] Int. Cl.$^6$ .................. H01L 31/0328; H01L 31/0336; H01L 31/072; H01L 31/109
[52] U.S. Cl. ........................................ 257/192; 257/347
[58] Field of Search ............................. 257/192, 347, 257/348

[56] References Cited

U.S. PATENT DOCUMENTS 4,952,527  8/1990  Lalawa et al. ..................... 257/349
5,276,340  1/1994  Yokoyama et al. .................. 257/194

FOREIGN PATENT DOCUMENTS 63-222462  9/1988  Japan.

*Primary Examiner*—Stephen Meier
*Attorney, Agent, or Firm*—Staas & Halsey

[57] ABSTRACT

E and D mode HEMTs are integrated in a laminated layer of pairs of GaAs/AlGaAs layers formed on the same GaAs-on-Si substrate. The gate electrodes of E and D mode HEMTs are formed on different GaAs layers. The GaAs layer on Si contains crystal defects. It is hypothesized that the defects extend upward in the laminated layer of pairs of GaAs/AlGaAs layers formed on the GaAs layer with such crystal defects. Etch pits are generated as the AlGaAs layer is etched by ammonium etchant. Generation of etch pits can be suppressed by etching the whole part of the exposed AlGaAs layer and exposing the GaAs layer under the gate electrode.

20 Claims, 11 Drawing Sheets

D-MODE

E-MODE

E-MODE   D-MODE

COMPOUND SEMICONDUCTOR DEVICE ON SILICON SUBSTRATE AND METHOD OF MANUFACTURING THE SAME

This application is a continuation of application Ser. No. 08/216,325, filed Mar. 23, 1994, now abandoned.

BACKGROUND OF THE INVENTION a) Field of the Invention

The present invention relates to a semiconductor device formed on a compound semiconductor grown on a silicon substrate. More particularly, the invention relates to a semiconductor integrated circuit having a plurality type of field effect transistors formed on a group III–V compound semiconductor such as gallium arsenide (GaAs) grown on a silicon substrate.

Although a silicon substrate has an electron mobility smaller than a GaAs substrate, it shows many excellent points such as light wafer weight, high thermal conductivity, low cost, high mechanical strength, ease in obtaining a large diameter wafer, and the like. For this reason, a so-called GaAs-on-Si technique has been studied in which a compound semiconductor, typically GaAs, is formed as a transport layer on a silicon substrate.

b) Description of the Related Art

A high electron mobility transistor (HEMT) utilizes a non-doped or slightly doped transport channel layer making a hetero junction with a wider band gap (barrier) semiconductor layer. By the band offset at the hetero junction, a narrow potential valley is formed in the transport channel layer adjacent to the hetero junction, which renders the charge carriers in the transport channel layer to be transported as a two dimensional electron (carrier) gas (2DEG). Low impurity concentration in the transport channel layer and the 2DEG transport make a very high mobility possible. There may or may not be provided a doped carrier supply layer in the barrier semiconductor layer. A HEMT has been formed on a silicon substrate by the same method as it is formed on a GaAs substrate.

The most important process of forming an element is a selective dry etching process. This process forms an opening for a gate electrode by reactive ion etching (hereinafter called RIE) using reactive plasma gas. A threshold voltage, the most significant property of a transistor, is determined by this process.

In forming a HEMT large scale integrated (LSI) circuit, two different types of HEMTs including an enhancement type (hereinafter called E mode) HEMT and a depletion type (hereinafter called D mode) HEMT are used so as to form a basic logic circuit called a DCFL (Direct Coupled FET Logic).

An E mode transistor (E mode element) has a positive threshold voltage, whereas a D mode transistor (D mode element) has a negative threshold voltage. A serial connection of a D mode element and an E mode element forms an inverter in which the E mode element operates as a driver and the D mode element operates as a load.

A conventional method of forming an E mode element and a D mode element on a GaAs substrate will be explained with reference to FIGS. 7A to 7G.

Figure 7A:
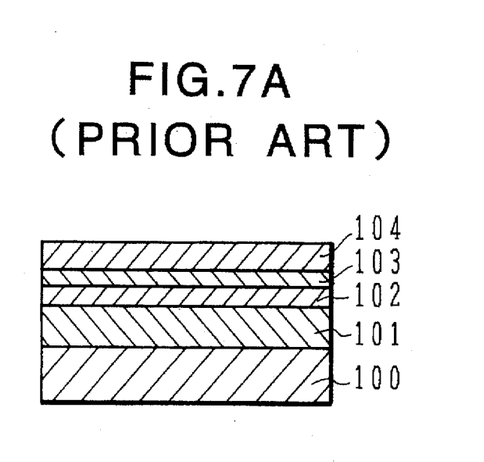
FIGS. 7A to 7G are cross sectional views of a semiconductor substrate and a semiconductor device explaining a conventional method of manufacturing a semiconductor device.

FIG. 7A shows a GaAs substrate 100 on which an AlGaAs layer 101, a GaAs layer 102, an AlGaAs layer 103, and a GaAs layer 104 are epitaxially grown.

Figure 7B:
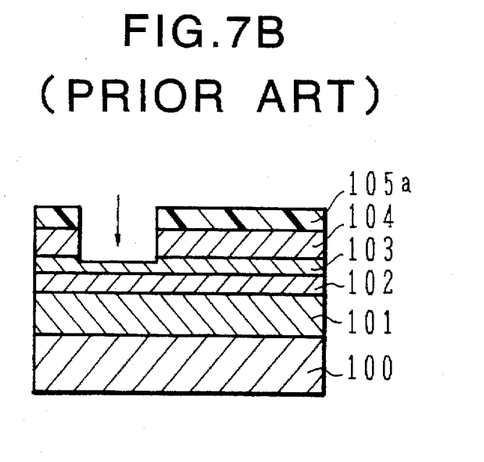

FIG. 7B illustrates an HIE process for forming a gate electrode of an E mode element. A resist film is coated and partially removed by photolithography from the area where the gate electrode of the E mode element is formed, to thus form a resist mask 105a.

By using the resist mask 105a as an etching mask, the GaAs layer 104 is selectively etched by RIE. A mixed gas of $CCl_2F_2$ and He is generally used as an etching gas.

Etching stops at the AlGaAs layer 103a because the etching speed for AlGaAs is extremely lower than that for GaAs if the mixed gas of $CCl_2F_2$ and He is used as the etching gas.

AlGaAs is generally susceptible to damages by RIE. Damages by RIE are generally in the order of about 3 nm in depth of the AlGaAs layer 103.

Figure 7C:
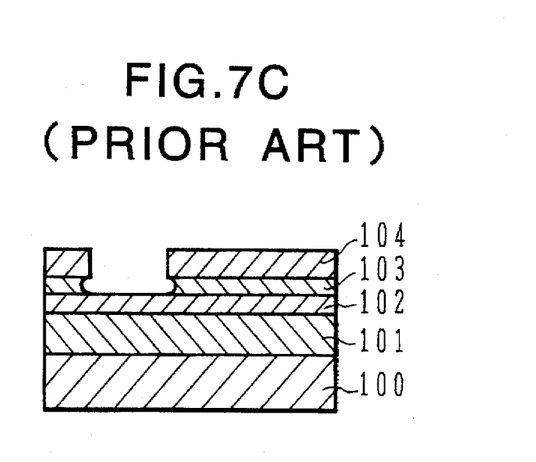

FIG. 7C illustrates a process of selectively etching the AlGaAs layer 103. After the GaAs layer 104 was selectively etched by RIE, the AlGaAs layer 103 is selectively etched by using an ammonium based etchant.

The ammonium based etchant does not substantially etch GaAs so that etching stops at the GaAs layer 102. This process is isotropic wet etching so that the AlGaAs layer 103 is etched also in the lateral direction. Thereafter, the resist mask 105a is removed.

Figure 7D:
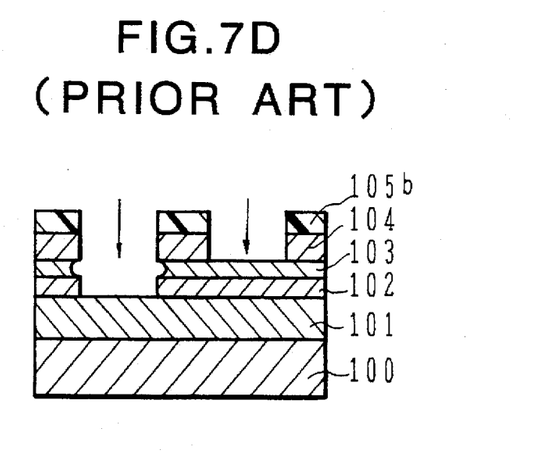

FIG. 7D illustrates a process of selectively etching the GaAs layers 102 and 104. A resist film 105b is patterned so as to form openings at the areas where the gate electrodes of the E and D mode elements are formed. The GaAs layers 102 and 104 are selectively etched by RIE. This RIE etching stops at the AlGaAs layers 101 and 103 similar to the process shown in FIG. 7B.

Damages by this RIE etching are generally in the order of about 3 nm in depth of the AlGaAs layers 101 and 103. It is not preferable to form a gate electrode on the damaged layer.

Figure 7E:
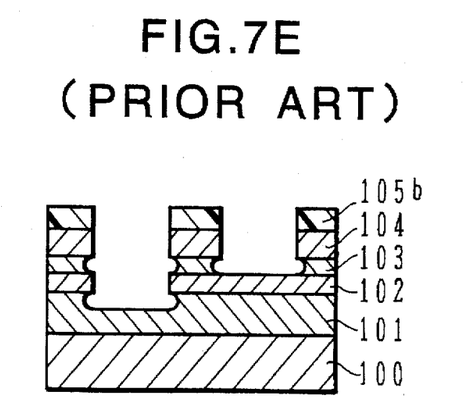

FIG. 7E illustrates a process of removing the etching damage layer formed on the surface of the AlGaAs layers 101 and 103. The surface of the AlGaAs layer 101 and the whole depth of the AlGaAs layer 103 are etched by IRE by using an ammonium based etchant, to thereby remove the etching damage layers.

Figure 7F:
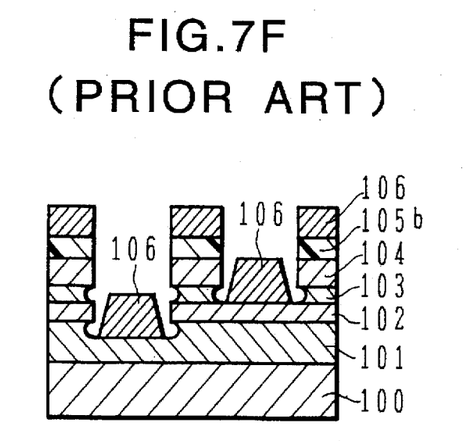

FIG. 7F illustrates a process of vapor-depositing aluminum (Al). An Al layer 106 is vapor-deposited on the surface of the AlGaAs layer 101 and GaAs layer 102 exposed by the processes up to FIG. 7E, and on a resist film 105b.

Figure 7G:
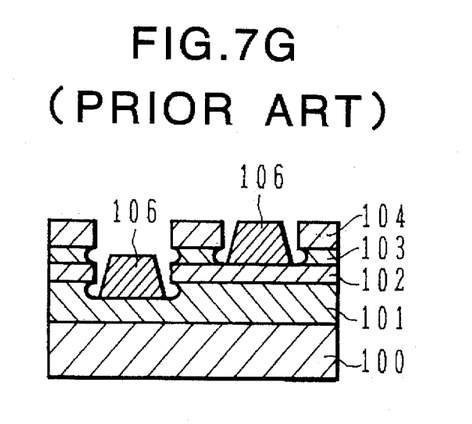

FIG. 7G illustrates a process of removing the resist film 105b and the Al layer 106 on the resist film 105b. The resist film 105 is removed by using a resist remover so that the Al layer 106 on the resist film 105 is lifted off at the same time.

With these processes, the E mode element is formed on the left side of FIG. 7G and the D mode element is formed on the right side. These processes are standard processes used for forming E and D mode HEMTs on a GaAs substrate.

The same processes as those shown in FIGS. 7A to 7G are used for forming HEMTs on GaAs layers and AlGaAs layers formed on a silicon substrate by CVD or the like.

HEMTs formed by the above processes on GaAs and AlGaAs layers grown on a GaAs substrate have good characteristics. However, in the case of HEMTs formed by the above processes on GaAs and AlGaAs layers grown on a silicon substrate, although the characteristics of D mode elements are good, the characteristics of E mode elements change from one element to another, being unable to obtain stable characteristics of E mode elements.

Figure 8:
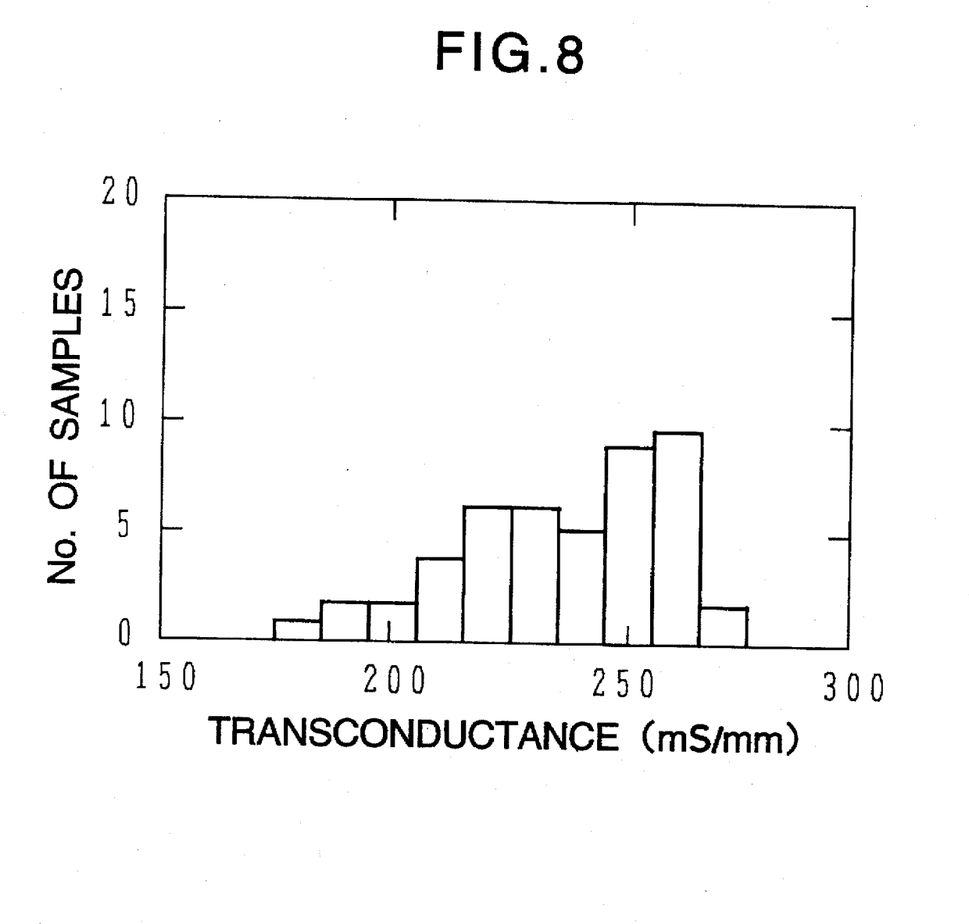
FIG. 8 is a transconductance histogram of semiconductor devices manufactured by a conventional method.

FIG. 8 is a transconductance histogram of E mode elements formed by the above processes shown in FIGS. 7A to 7G on GaAs and AlGaAs layers grown on a silicon substrate. The abscissa represents the transconductance, and the ordinate represents the number of samples.

As seen from FIG. 8, the distribution of transconductances is wide from 180 mS/mm to 270 mS/mm. The standard deviation is about 18 mS/mm.

SUMMARY OF THE INVENTION

It is an object of the present invention to provide a technique of forming an integrated circuit having a small change in the characteristics, on compound semiconductor layers grown on a silicon substrate.

According to one aspect of this invention, there is provided a compound semiconductor device on a silicon substrate having at least two transistors with different threshold values, comprising: a silicon substrate; a compound semiconductor laminated layer epitaxially grown on said silicon substrate, said laminated layer including at least two pairs of first and second compound semiconductor layers, said first compound semiconductor layer having a wider band gap energy than that of said second compound semiconductor layer; at least a pair of gate electrodes formed on exposed two different layers of said second compound semiconductor layers of said compound semiconductor laminated layer.

The characteristics of a plurality type of transistors can be made uniform by using the same type of a compound semiconductor layer under each gate electrode. For example, pits just under the gate electrode can be eliminated. It is therefore possible to suppress a change in the characteristics of manufactured semiconductor devices.

It is possible to suppress a change in the characteristics of field effect transistors having a gate electrode structure formed in a compound semiconductor grown on a silicon substrate, thereby enabling to improve the manufacturing yield of LSIs.

DETAILED DESCRIPTION OF THE PREFERRED EMBODIMENTS

As compared with HEMTs (high electron mobility transistors) formed on a GaAs substrate, HEMTs formed by using a GaAs-on-Si technique are excellent in weight, thermal conductivity, cost, mechanical strength, and the like. However, since GaAs and Si have different lattice coefficients, thermal expansion coefficients, and the like, many crystal defects such as dislocations are generated.

These crystal defects are difficult to be suppressed even when a number of epitaxial layers are laminated, and defects are generated also in upper layers. It can be hypothesized that these crystal defects adversely affect the element characteristics.

According to the analysis by the present inventors, all of these crystal defects do not adversely affect the element characteristic, but defects of a limited number of types adversely affect the element characteristics.

Influence of crystal defects differs between a depletion (D) mode element and an enhancement (E) mode element. Specifically, in the case of HEMTs formed on a laminated layer of GaAS and AlGaAs grown on a silicon substrate, although the characteristics of D mode elements are good, the characteristics of E mode elements change from one element to another, posing a serious problem in practical use. It is important to know how crystal defects adversely affect the characteristics of E mode elements.

Figure 1:
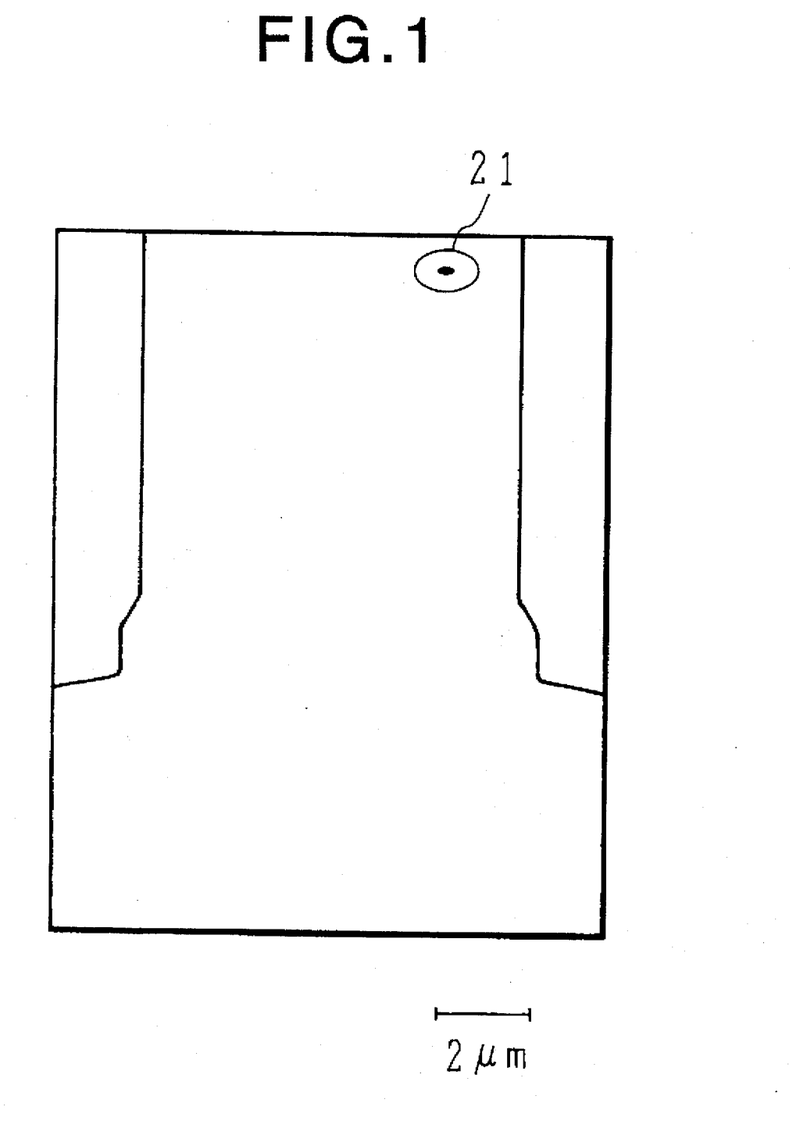
FIG. 1 is an illustration of a photograph taken by an electron microscope, showing a pit generated just under the gate electrode of a semiconductor device.

FIG. 1 is an illustration of a photograph taken by an electron microscope, showing an E mode element with the gate electrode removed therefrom. As shown, a pit having a diameter of about 1 μm and formed by a nucleus indicated by a circle was observed. It can be hypothesized that this pit affects the element characteristics more or less. Such a pit was not observed immediately after the crystal was grown. As a result, it is certain that the pit was generated during the manufacturing processes.

Figure 2:
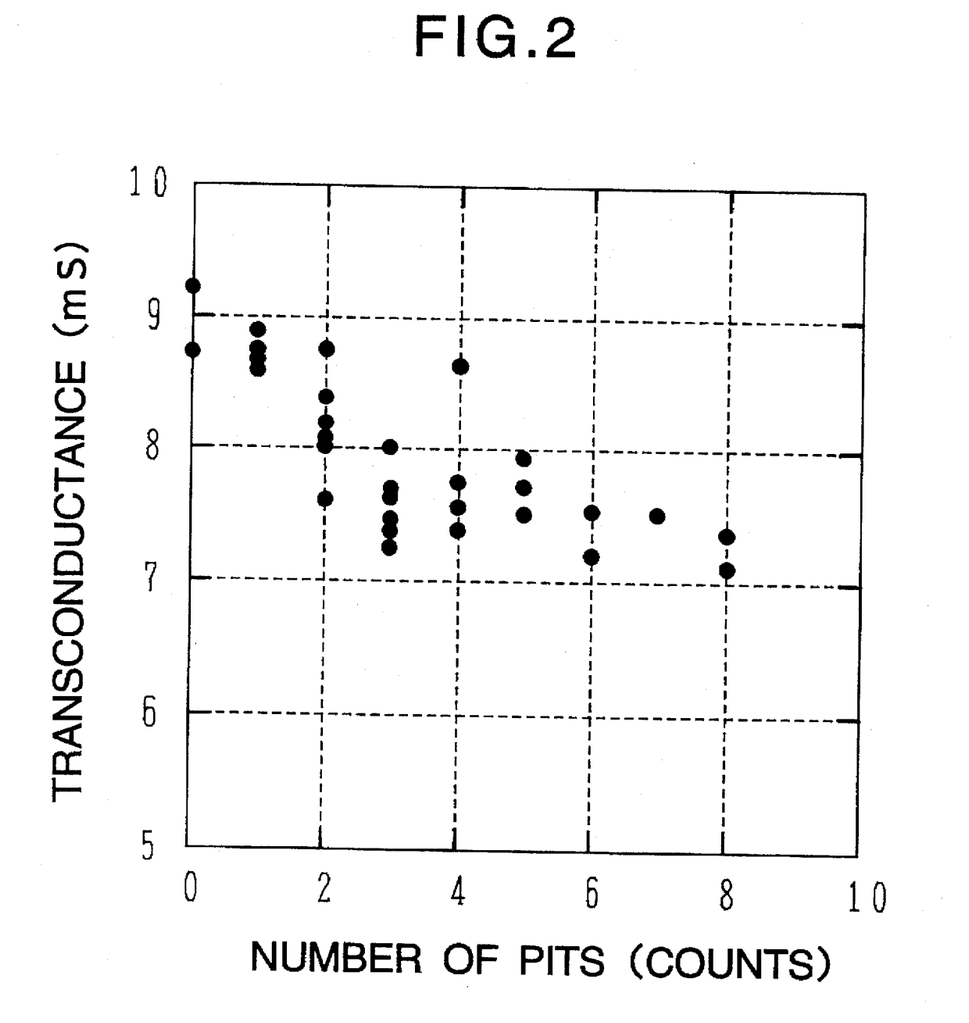
FIG. 2 is a graph showing the relationship between the transconductance and the number of pits generated just under the gate electrode of a semiconductor device.

FIG. 2 is a graph showing the relationship between transconductance and the number of pits. The transconductance of an element from which no pit was observed was about 9 mS. As the number of pits increased, the transconductance lowered. The transconductance of an element from which eight pits were observed was about 7.2 mS. The characteristics of an element degraded the more the element had pits.

The gate width of each sample element was about 50 μm. The experiment results can be clarified assuming that the diameter of a pit is about 1 to 2 μm and that substantially no current will flow through a pit. It can be hypothesized that the presence of a pit changes the characteristics of elements formed on a laminated layer of GaAs/AlGaAs grown on a silicon substrate more than the characteristics of elements formed on a GaAs substrate.

The reason why a pit is generated is still not certain. It is not possible to reduce the number of pits greatly even if the growth conditions such as a presence/absence of thermal cycles and a growth temperature of GaAS and AlGaAs layers are controlled.

The characteristics of an element formed on a GaAs substrate are not degraded. It can be therefore hypothesized that a pit is generated by defects specific to compound semiconductor crystals grown on a silicon substrate. In other words, defects at an interface between Si and GaAs extends upward through epitaxial layers.

The reason of pit generation can be assumed, for example, in the following way. FIGS. 3A to 3E illustrate main processes of forming HEMTs on a laminated layer of GaAs/AlGaAs grown on a Si substrate.

Figure 3A:
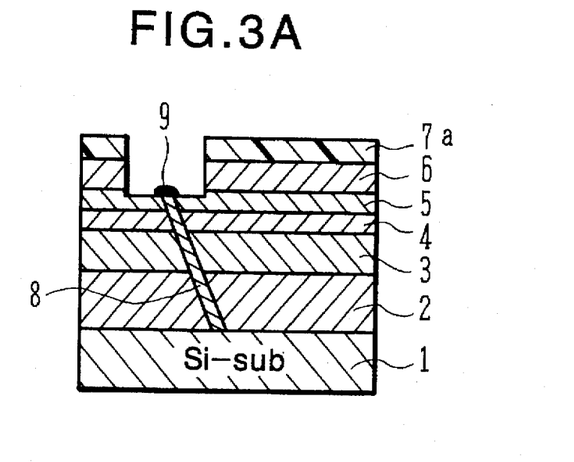
FIGS. 3A to 3E are cross sectional views and enlarged views of the area where a pit is generated, explaining the mechanism of generating a pit just under the gate electrode of a semiconductor device manufactured by a conventional method.

FIG. 3A illustrates an RIE process of selectively etching a GaAs cap layer for forming an ohmic contact only at the area where a gate electrode of an E mode element is formed.

A GaAs layer 2, an AlGaAs layer 3, a GaAs layer 4, an AlGaAs layer 5, and a GaAs layer (cap layer) 6 are formed on a silicon substrate 1 by CVD or other methods in this order from the bottom. Some defects caused by a difference of lattice coefficients between the GaAs layer 2 and the silicon substrate 1 generate a defect 8 which extends upward through the respective grown layers.

A resist film is coated on the substrate (on GaAs layer 6) and patterned by photolithography so as to form a resist mask 7a. Using this resist mask as an etching mask, the GaAs layer 6 is selectively etched by RIE. RIE stops at the surface of the AlGaAs layer 5 because of a difference between etching rates. An AlGaAs layer is susceptible to damages by RIE so that the defect 8 is further affected by RIE. A surface defect 9 is therefore generated on the surface of the AlGaAs layer 5 exposed by etching, at the area corresponding to the defect 8. At this time, a pit is still not generated.

Figure 3B:
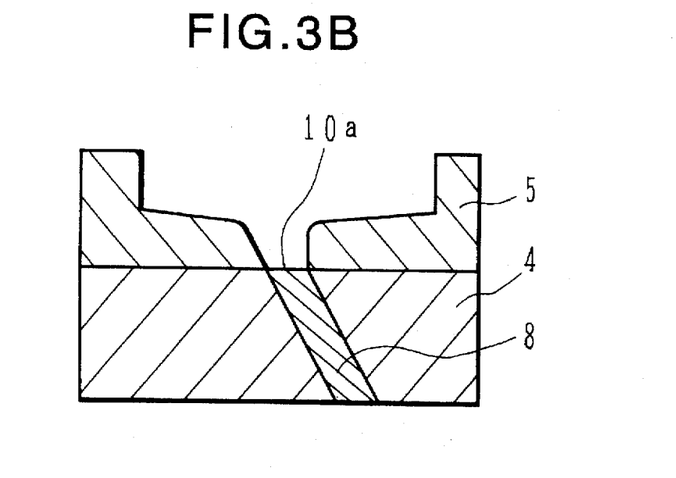

FIG. 3B illustrates a process of selectively etching the AlGaAs layer 5 by using ammonium based etchant. FIG. 3B is an enlarged view showing the area selectively etched by the process shown in FIG. 3A. Since the surface defect has a high etching rate, a pit 10a is generated from the nucleus of the surface defect 9.

Figure 3C:
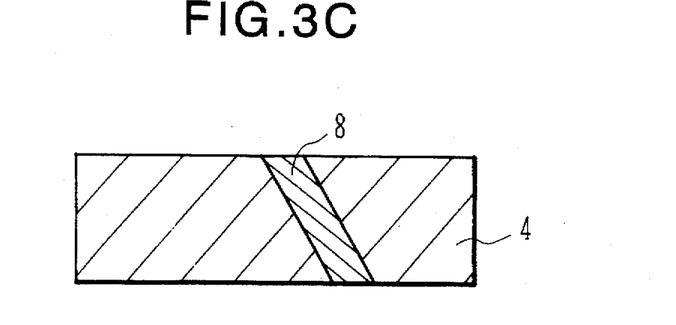

FIG. 3C is an enlarged cross sectional view showing the area from which the AlGaAs layer 5 corresponding to the gate electrode was selectively etched. At this selective etching, the GaAs layer 4 is not etched.

As a result, although the pit 10a is temporarily generated, it disappears eventually and no pit is generated on the surface of the GaAs layer 4.

Figure 3D:
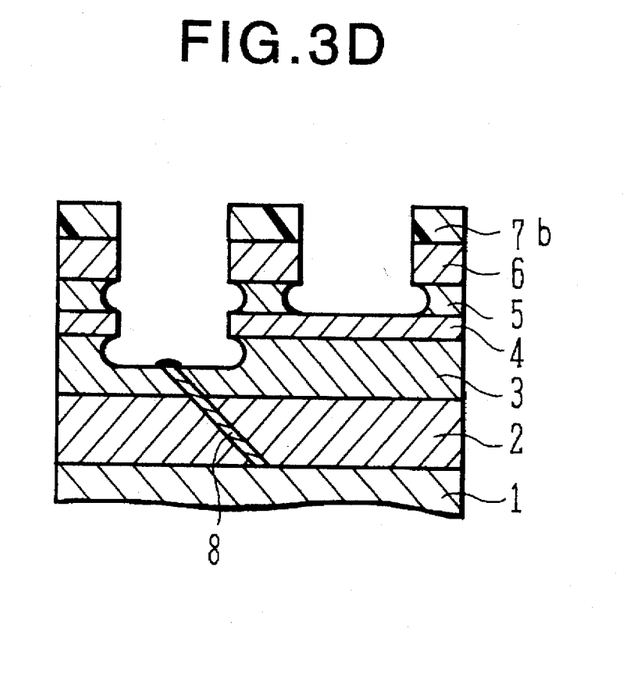

FIG. 3D illustrates the processes of selectively etching by RIE the areas where the gate electrode of the E and D mode elements are formed, and removing the etching damage layer on the AlGaAs layer 5 by using ammonium based etchant.

After the AlGaAs layer 5 corresponding to the gate electrode of the E mode element was selectively etched as shown in FIG. 3C, the resist film 7a is removed. A resist film is coated and patterned to form a new resist pattern 7b having openings where the gate electrodes of the E and D mode elements are formed.

By using this resist pattern 7b as an etching mask, the GaAs layers 4 and 6 are selectively etched by RIE. At this time, a surface defect is formed on the surface of the AlGaAs layer 3 by the same mechanism explained with reference to FIG. 3A.

After the GaAs layers 4 and 6 were selectively etched, the AlGaAs layer 5 where the gate electrode of the D mode element is formed, is selectively etched by using ammonium based etchant, and at the same time, the etching damage layer on the exposed surface of the AlGaAs layer 3 where the gate electrode of the E mode element is formed, is removed. At this time, like the process explained with reference to FIG. 3B, a pit is generated because of a nucleus as the surface defect formed on the surface of the AlGaAs layer 3.

Figure 3E:
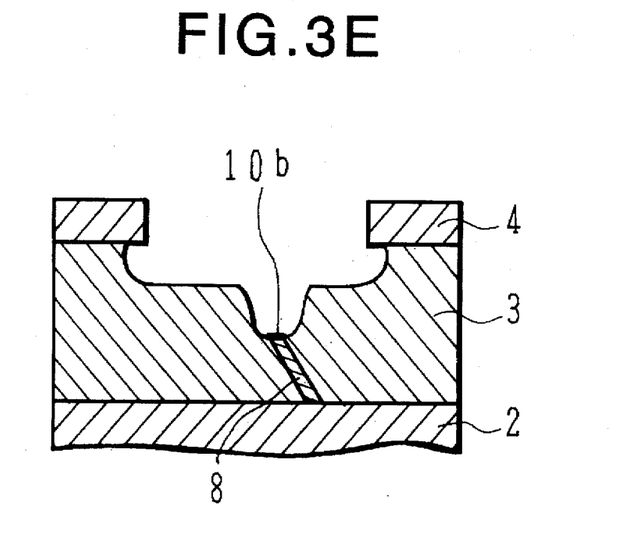

FIG. 3E is an enlarged cross sectional view showing the area where the etching damage layer on the AlGaAs layer 3 was removed. As shown, a pit 10b is generated on the surface of the AlGaAs layer 3 at the position corresponding to the defect 8.

A pit may be generated at the area corresponding to the gate electrode of the D mode element when the AlGaAs layer 5 is selectively etched. However, this pit is disappears eventually after the AlGaAs layer 5 corresponding to the gate electrode was selectively etched, because the surface of the GaAs layer 4 is exposed.

As explained above, an etch pit is generated at the area corresponding to the gate electrode of the E mode element, whereas an etch pit is not generated at the area corresponding to the gate electrode of the D mode element. This phenomenon coincides with the experiment results that the characteristics of E mode elements change greatly whereas the characteristics of D mode elements change less.

From the above assumption, it is understood that a pit will not be generated if the layer just under the gate electrode is not an AlGaAs layer but a GaAs layer. In the above assumption, the surface defect 9 is assumed to be formed by a defect 8. A presence of only the defect 8 without the surface defect 9 may result in the above phenomenon.

From the fact that the characteristics of only E mode elements are degraded, it can be hypothesized that the formation of a pit degrades the characteristics whereas a presence of only a defect 8 does not degrade the characteristics.

Figure 4A:
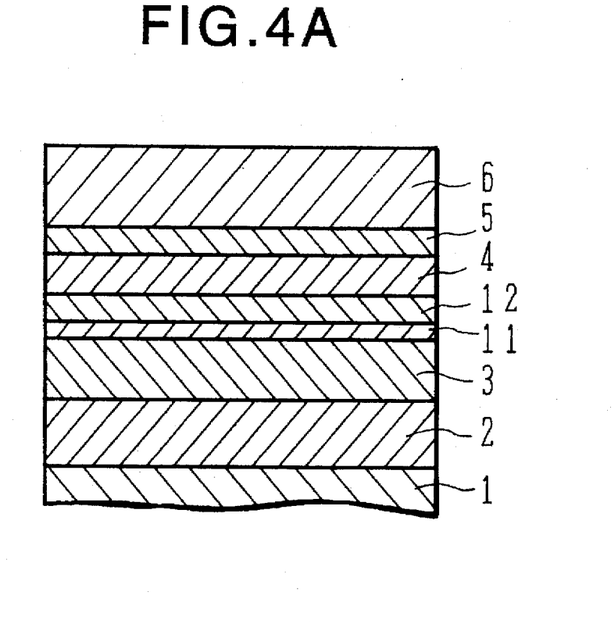
FIGS. 4A to 4C are cross sectional views of a semiconductor substrate explaining the processes of manufacturing a semiconductor device having a structure capable of preventing a pit from being generated just under a gate electrode, according to an embodiment of this invention.
Figure 4B:
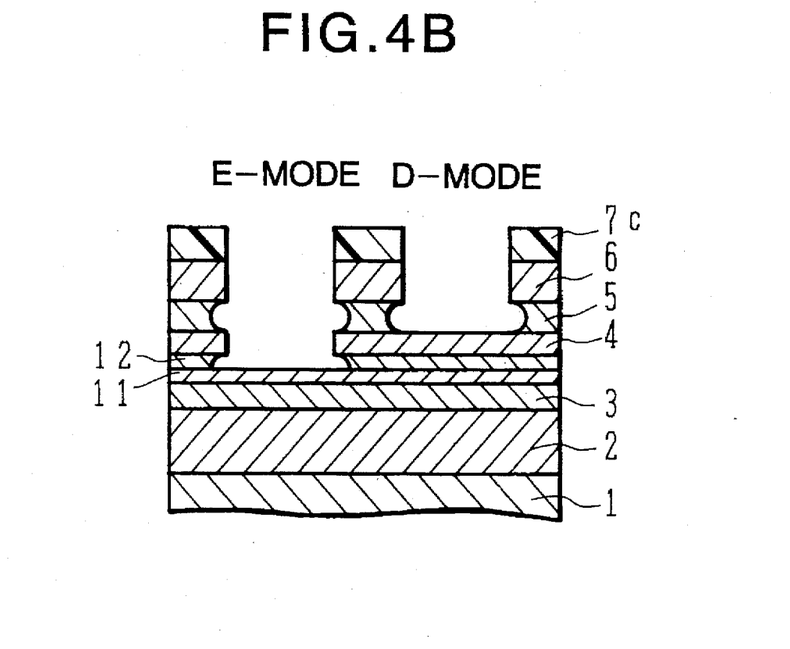
Figure 4C:
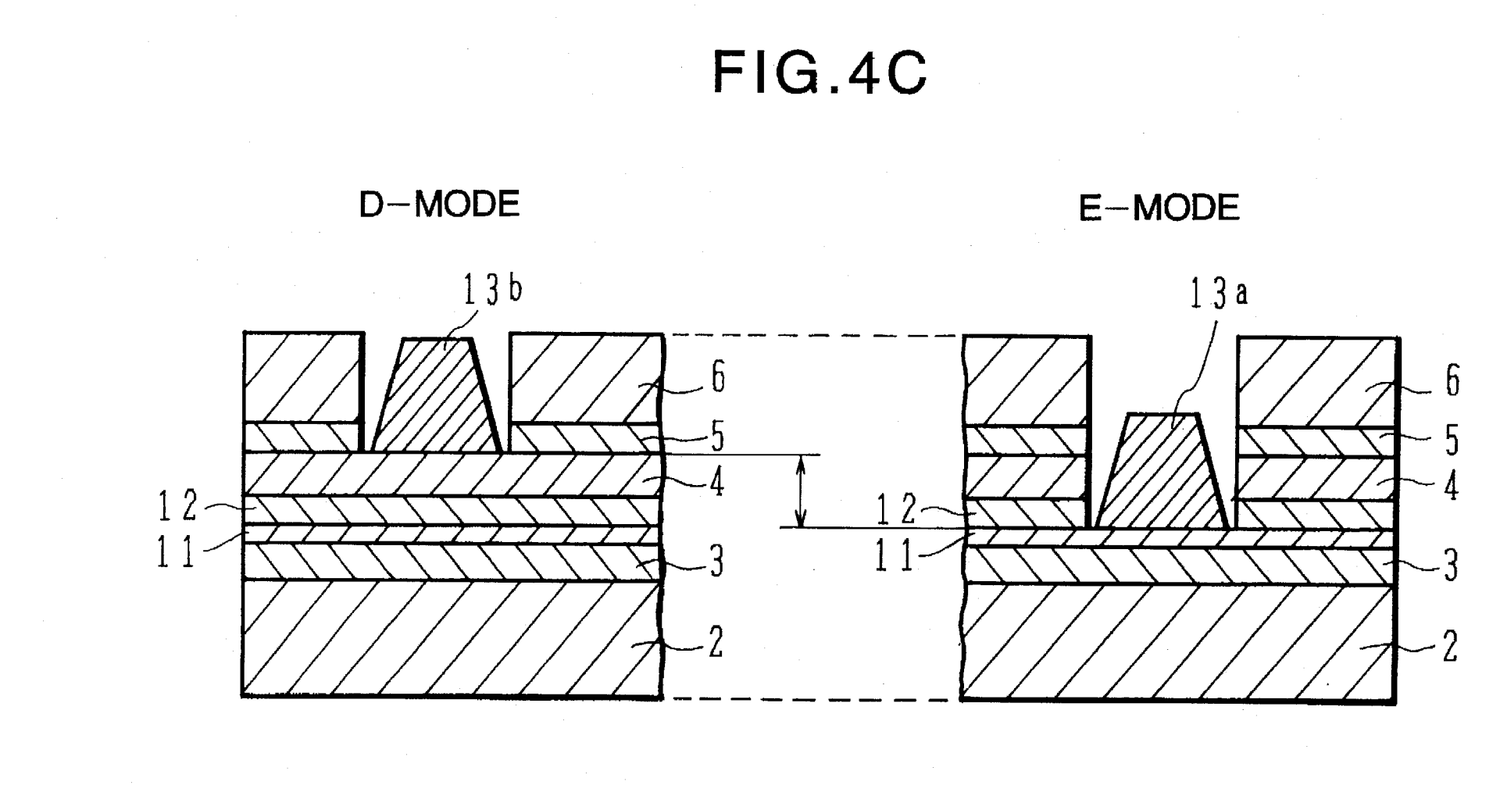

FIGS. 4A to 4C are cross sectional views of a semiconductor substrate explaining the processes of manufacturing a semiconductor device, wherein the layer just under the gate electrode of an E mode element is a GaAs layer. Specifically, an etching stopper layer relative to ammonium based etchant is made of two layers including a GaAs layer just under the gate electrode of an E mode element, so that the E mode element having a structure similar to a D mode element can be manufactured.

FIG. 4A is a cross sectional view showing the layer structure of a substrate wherein a GaAs layer is used just under the gate electrode of an E mode element. A GaAs layer 2, an AlGaAs layer 3, a pit stop GaAs layer 11, a second dry etching stop AlGaAs layer 12, a GaAs layer (pit stop layer) 4, a first dry etching stop AlGaAs layer 5, and a GaAs layer (cap layer) 6 are formed on a silicon substrate 1 by CVD or other methods in this order from the bottom. The pit stop GaAs layer 11 functions as an etching stopper layer relative to ammonium based wet etching.

FIG. 4B is a cross sectional view of a substrate after the areas corresponding to the gate electrodes of E and D mode elements were selectively etched by processes similar to FIGS. 3A to 3E. The area corresponding to the gate electrode of the D mode element has the same structure as FIG. 3D. The area corresponding to the gate electrode of the E mode element exposes the GaAs layer 11 which functions as the etching stopper layer.

With this structure, it becomes possible to prevent a generation of a pit at the area corresponding to the gate electrode of the E mode element. The GaAs layer 4 under the first dry etching stop AlGaAs layer 5 is used as a layer which provides a difference of threshold voltages between the E and D mode elements, whereas the GaAs layer 11 under the second dry etching stop AlGaAs layer 12 functions as a pit generation preventing layer.

The width of the pit stop GaAs layer 11 is preferably 2 to 10 nm so that it provides a sufficient etching stopper for wet etching and does not adversely affect the operation of HEMT.

Several points to be taken into consideration when elements having such a structure are manufactured will be explained with reference to FIG. 4C.

A cross sectional view of a D mode element is shown on the left side of FIG. 4C, and another cross sectional view of an E mode element is shown on the right side. In the case of the E mode element, the AlGaAs layer 3 and pit stop GaAs layer 11 are interposed between the surface of the GaAs layer 2 where two-dimensional gas is generated and the gate electrode 13a.

In the case of the D mode element, the AlGaAs layer 3 and pit stop GaAs layer 11 as well as the second dry etching stop AlGaAs layer 12 and GaAs layer 4 are interposed between the surface of the GaAs layer 2 where two-dimensional electron gas is generated and the gate electrode 13b.

In the case of HEMTs shown in FIG. 3D, a difference of threshold voltages between E and D mode elements is determined generally only by the GaAs layer 4. However, in the present embodiment, a difference between threshold voltages are determined by two layers of the GaAs layer 4 and AlGaAs layer 12. It is therefore necessary to control these layer structures.

The film thickness of a conventional GaAs layer 4 is 70 to 100 angstroms. In this embodiment, generally the same threshold values were obtained when the total thickness of the two layers was set to 70 to 90 angstroms. The film thickness necessary for the second dry etching stop AlGaAs layer 12 is generally about 30 angstroms so that the film thickness of the GaAs layer 4 is required to be made as thin as about 40 to 70 angstroms.

The GaAs layer 11 just under the gate electrode 13a of the E mode element has a narrow band gap which lowers a Schottky barrier. As a result, when a gate voltage is applied to turn on the E mode element, a gate leakage current is likely to increase.

This increase in the gate leakage current lowers the drive capacity of an E mode element HEMT which is used as a signal input element in a direct coupled FET logic (DCFL) circuit. In order to prevent a gate leakage current from being increased, it is preferable that impurities are not doped In the GaAs layer 11 just under the gate electrode of an E mode element.

A more particular embodiment will be explained next.

Figure 5A:
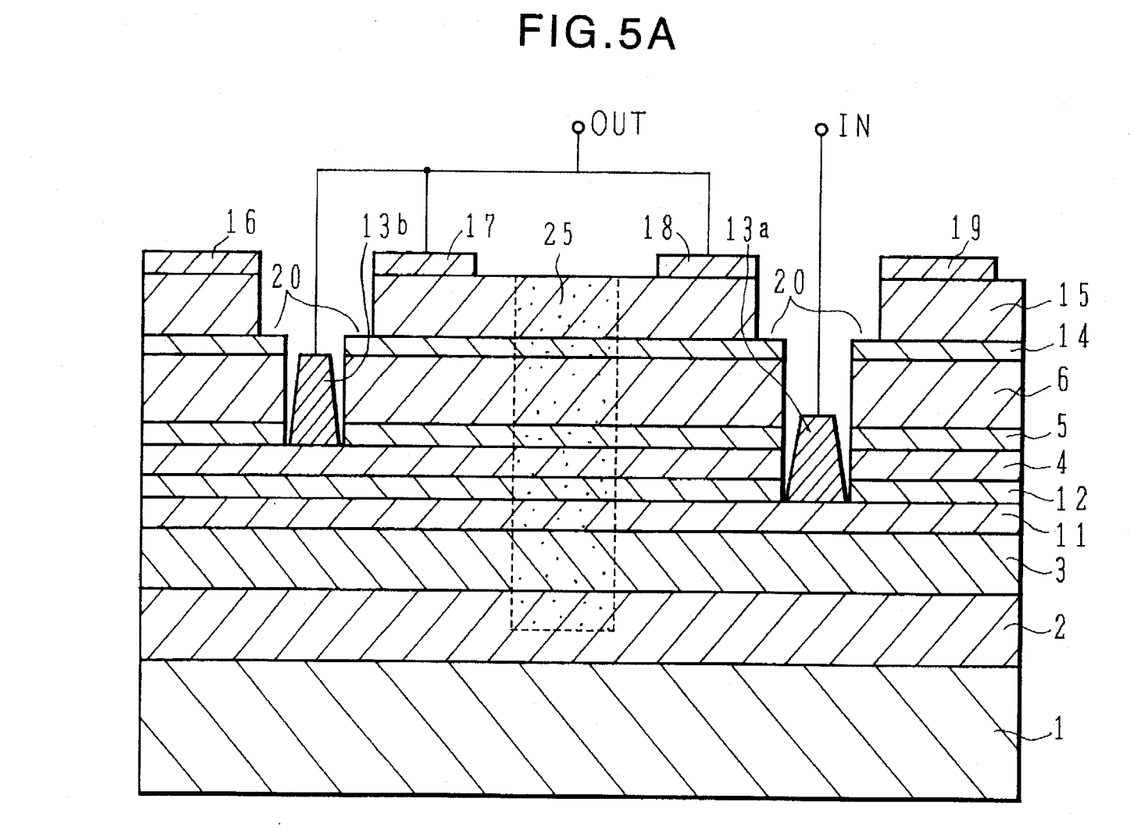
FIGS. 5A and 5B are a cross sectional view of a semiconductor device according to an embodiment of this invention, and an equivalent circuit of a DCFL basic circuit.

FIG. 5A is a cross sectional view showing a semiconductor device according to an embodiment of this invention. A D mode element is shown on the left side of FIG. 5A, and an E mode element is shown on the right side. A GaAs layer 2, an AlGaAs layer 3, a pit stop GaAs layer 11, a third dry etching stop AlGaAs layer 12, a GaAs layer 4, a second dry etching stop AlGaAs layer 5, a second GaAs cap layer 6, a first dry etching stop AlGaAs layer 14, and a first GaAs cap layer 15 are formed on a silicon substrate 1 by metal organic chemical vapor deposition (MOCVD) in this order from the bottom.

The structures under the gate electrodes are the same as FIG. 4C. The pit stop GaAs layer 11 is formed just under the gate electrode 13a of the E mode element. Specifically, a two-layer structure of the AlGaAs layer 3 and GaAs layer 11 is interposed between the surface of the GaAs layer 2 where two-dimensional electron gas is generated and the gate electrode 13a.

In the case of the D mode element, a four-layer structure of the AlGaAs layer 3, GaAs layer 11, AlGaAs layer 12, and GaAs layer 4 is interposed between the surface of the GaAs layer 2 where two-dimensional electron gas is accumulated and the gate electrode 13b.

A source electrode 16 and a drain electrode 17 are formed on the first GaAs cap layer on both sides of the aluminum gate electrode 13b of the D mode element. The source and drain electrodes are made of a laminated layer of an AuGe alloy layer having a thickness of about 20 nm and an Au layer having a thickness of about 200 nm. AuGe/Au source and drain electrodes 18 and 19 are formed on both sides of the aluminum gate electrode 13a of the E mode element.

The structure of the device shown in FIG. 5A is different from that shown in FIG. 4C in that the etching stop AlGaAs layer 14 is formed between the cap layers 6 and 15 above the AlGaAs layer 5. This layer 14 is introduced to provide some margin for mask pattern alignment which becomes necessary when the ohmic electrodes 16, 17, 18, and 19 and the gate electrodes 13a and 13b are formed.

Specifically, the first dry etching stop AlGaAs layer 14 provides steps 20 between the cap layers 6 and 15. These steps 20 allow the gate electrodes 13a and 13b and ohmic electrodes 16, 17, 18, and 19 to be formed while providing a sufficient margin of position alignment.

The D mode HEMT and E mode HEMT are isolated by an oxygen ion doped region 15 formed from the substrate surface down to the depth lower than two-dimensional electron gas in the GaAs layer 2. Such an isolation region is also formed where element isolation is necessary.

The gate electrode 13b of the D mode HEMT is connected to the ohmic electrode 17, to the ohmic electrode 18 of the E mode HEMT, and to an output terminal OUT. The gate electrode 13a of the E mode HEMT is connected to an input terminal IN.

The thickness and impurity concentration of each layer are given by way of example. The film thickness of the GaAs layer 2 on the silicon substrate 1 is about 2 μm, and the film thickness of the pit stop GaAs layer 11 is about 3 nm.

The film thickness of the AlGaAs layer 3 is about 26 nm. The film thicknesses of the third dry etching stop AlGaAs layer 12, second dry etching stop AlGaAs layer 5, and first dry etching stop AlGaAs layer 14 are all about 3 nm.

The AlAs mole ratio of each of the AlGaAs layers is 0.25. Each AlGaAs layer is an AlGaAs layer doped with silicon at a concentration of $1.4 \times 10^{18}$ cm$^{-3}$.

The thicknesses of the GaAs layer 4, second GaAs cap layer 6, and first GaAs cap layer 15 are about 6 nm, 30 nm, and 30 nm, respectively. Each GaAs layer is a GaAs layer doped with silicon at a concentration of $1.9 \times 10^{18}$ cm$^{-3}$.

The layers excepting the GaAs layer 11 above the transport layer 2 where two-dimensional electron gas is generated, are all doped with Si and made n-type, and particularly the GaAs layers excepting the GaAs layer 11 have a high doping concentration. It is preferable not to dope impurities into the GaAs layer 11 in contact with the gate electrode of the E mode element as described previously.

Figure 5B:
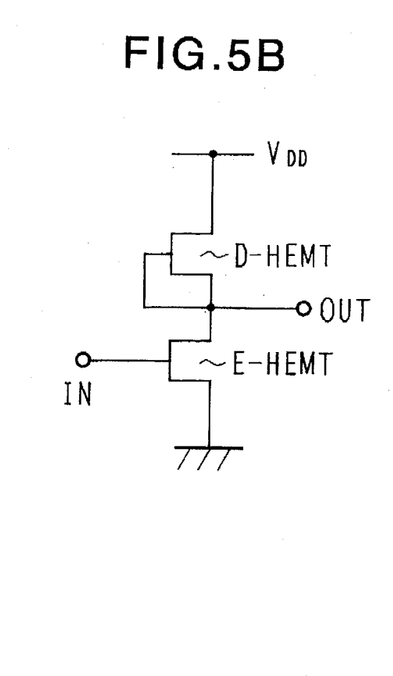

FIG. 5B is an equivalent circuit diagram of a DCFL circuit. A D mode HEMT and an E mode HEMT are connected in series between a supply voltage VDD and a ground potential. The input terminal IN is connected to the gate of the E mode HEMT, and the interconnection between the E and D mode HEMTs is connected to the output terminal OUT and to the gate of the D mode HEMT.

Figure 6:
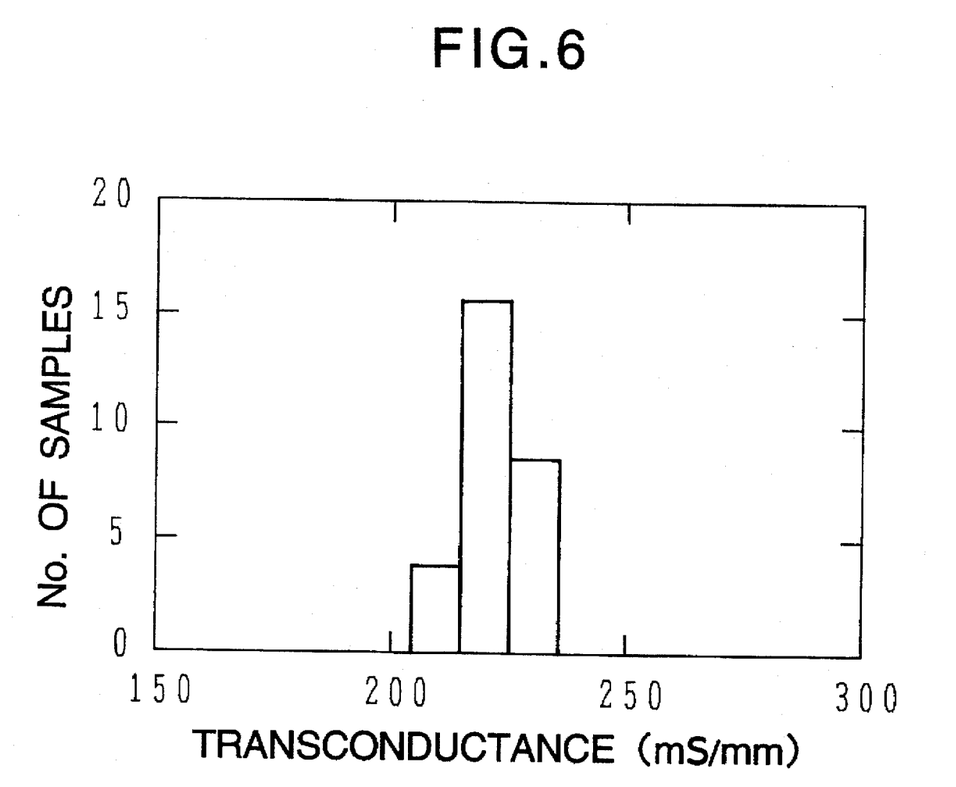
FIG. 6 is a transconductance histogram of semiconductor devices according to an embodiment of this invention.

FIG. 6 is a histogram showing a distribution of transconductances of E mode elements having the structure shown in FIG. 5A. The abscissa represents a transconductance and the ordinate represents the number of samples having a transconductance within the corresponding range. The transconductances of all samples converged in the range from 210 mS/mm to 240 mS/mm, and the standard deviation was 5.3 mS/mm.

As apparent from the comparison between the two histograms shown in FIGS. 6 and 8, the standard deviation of the distribution of transconductances of E mode elements of this embodiment lowered considerably as compared to conventional E mode elements. According to the embodiment, it is possible to manufacture E mode elements with a small change in characteristics.

HEMTs of an AlGaAs/GaAs structure has been described above. The advantages of the embodiment may also be attained by using other materials. For example, heterojunction materials such as InGaP/GaAs and InAlGaAs/InGaAs may also be used.

Dry RIE with $CCl_2F_2$ and wet etching with ammonium aqueous solution have been used illustratively. Other etching may also be used so long as the dry etching generates a damage layer and the wet etching changes its etching rate with crystal properties.

HEMTs have been used in the above embodiment. The invention is not limited only to HEMTs. It is apparent to those skilled in the art that other transistors, especially other field effect transistors such as MESFETs may also be used.

The present invention has been described in connection with the preferred embodiments. The invention is not limited only to the above embodiments. It is apparent to those skilled in the art that various modifications, substitutions, combinations and the like can be made without departing from the scope of the appended claims.

We claim:

1. A compound semiconductor device on a silicon substrate having at least two transistors with different threshold values, comprising:
    a silicon substrate;
    a compound semiconductor laminated structure epitaxially grown on said silicon substrate, said laminated structure including first and second laminates with the second laminate being disposed on the first laminate, each laminate comprising first and second compound semiconductor layers, said first compound semiconductor layer having a wider band gap energy than that of said second compound semiconductor layer, the second compound semiconductor layer of said first laminate being substantially undoped; and
    two gate electrodes formed respectively on exposed portions of said second compound semiconductor layers of said first and second laminates.

2. A compound semiconductor device on a silicon substrate according to claim 1, wherein said laminated structure includes a third laminate formed on the first and second laminates, the third laminate comprising said first and second compound semiconductor layers, the compound semiconductor device further comprising:
    two pairs of current electrodes formed on said laminated structure, each pair of current electrodes having a corresponding gate electrode of said two gate electrodes, the electrodes of each pair of current electrodes being formed on opposing sides of the corresponding gate electrode.

3. A compound semiconductor device on a silicon substrate according to claim 2, wherein each pair of current electrodes includes a source electrode and a drain electrode, the device further comprising an electrical connector for electrically connecting the gate electrode formed on said second laminate with the drain electrode corresponding thereto and the source electrode corresponding to the gate electrode formed on the first laminate.

4. A compound semiconductor device on a silicon substrate according to claim 3, wherein said laminated structure includes a transport layer under said first and second laminates, said first compound semiconductor layer of said first laminate being formed between said transport layer and said second compound semiconductor layer of said first laminate, said transport layer having a narrower band gap energy than said second compound semiconductor layer and establishing a narrow channel for two dimensional carrier gas.

5. A compound semiconductor device on a silicon substrate according to claim 4, wherein said transport layer consists essentially of GaAs.

6. A compound semiconductor device on a silicon substrate according to claim 3, wherein said first compound semiconductor layer comprises AlGaAs and said second compound semiconductor layer comprises GaAs.

7. A compound semiconductor device on a silicon substrate according to claim 3, wherein said first compound semiconductor layer comprises InGaP and said second compound semiconductor layer comprises GaAs.

8. A compound semiconductor device on a silicon substrate according to claim 3 wherein said first compound semiconductor layer comprises InAlGaAs and said second compound semiconductor layer comprises InGaAs.

9. A compound semiconductor device on a silicon substrate according to claim 3, wherein the second compound semiconductor layer formed closest to the silicon substrate has a thickness of 2 to 10 nm.

10. A compound semiconductor device on a silicon substrate according to claim 3, further comprising:
    an output terminal connected to said electrical connector; and
    an input terminal connected to the drain electrode formed on the first laminate.

11. A compound semiconductor device on a silicon substrate having at least two transistors with different threshold values, comprising:
    a silicon substrate;
    a compound semiconductor laminated structure epitaxially grown on said silicon substrate, the laminated structure having crystal defects which extend from an interface between the silicon substrate and the laminated structure and through the laminated structure, said laminated structure including first and second laminates with the second laminate being disposed on the first laminate, each laminate comprising first and second compound semiconductor layers, said first compound semiconductor layer having a wider band gap energy than that of said second compound semiconductor layer, the first compound semiconductor layers of the first and second laminates having the crystal defects therein with the crystal defects in the first compound semiconductor layer of the first laminate, but not the second laminate, being subjected to reactive ion etching and then ammonia etching during fabrication;
    an E-mode gate electrode formed on an exposed portion of the second compound semiconductor layer of the first laminate; and
    a D-mode gate electrode formed on an exposed portion of said second compound semiconductor layer of said second laminate.

12. A compound semiconductor device on a silicon substrate according to claim 11, wherein said laminated structure includes a third laminate formed on the first and second laminates, the third laminate comprising said first and second compound semiconductor layers, the compound semiconductor device further comprising:

two pairs of current electrodes formed on said laminated structure, each pair of current electrodes having a corresponding gate electrode of said two gate electrodes, the electrodes of each pair of current electrodes being formed on opposing sides of the corresponding gate electrode.

13. A compound semiconductor device on a silicon substrate according to claim 11, wherein said laminated structure includes a transport layer and an intermediate layer under said first and second laminates, said intermediate layer being formed between said transport layer and said first and second laminates, said transport layer having a narrower band gap energy than said intermediate layer and establishing a narrow channel for two dimensional carrier gas.

14. A compound semiconductor device on a silicon substrate according to claim 13, wherein said transport layer consists essentially of GaAs.

15. A compound semiconductor device on a silicon substrate according to claim 13, wherein said first compound semiconductor layer comprise AlGaAs and said second compound semiconductor layer comprises GaAs.

16. A compound semiconductor device on a silicon substrate according to claim 13, wherein said first compound semiconductor layer comprises InGaP and said second compound semiconductor layer comprises GaAs.

17. A compound semiconductor device on a silicon substrate according to claim 11, wherein said first compound semiconductor layer comprises InAlGaAs and said second compound semiconductor layer comprises GaAs.

18. A compound semiconductor device on a silicon substrate according to claim 11, wherein said laminated structure includes a third laminate formed on the first and second laminates, the third laminate comprising said first and second compound semiconductor layers, the compound semiconductor device further comprising:

source and drain electrodes formed on the third laminate, each gate electrode having corresponding source and drain electrodes with the source and drain electrodes being formed on opposing sides of the corresponding gate electrode; and an electrical connector electrically connecting the D-mode gate electrode with the corresponding drain electrode and the source electrode corresponding to the E-mode gate electrode.

19. A compound semiconductor device on a silicon substrate according to claim 18, wherein the second compound semiconductor layer of said first laminate has a thickness of 2 to 10 nm.

20. A compound semiconductor device on a silicon substrate according to claim 18, wherein the second compound semiconductor layer of said first laminate is not substantially doped with impurities.

* * * * *

UNITED STATES PATENT AND TRADEMARK OFFICE
CERTIFICATE OF CORRECTION

PATENT NO. : 5,686,741
DATED : November 11, 1997
INVENTOR(S) : OHORI et al.

It is certified that error appears in the above-identified patent and that said Letters Patent is hereby corrected as shown below:

Col. 1, line 66, change "HIE" to --RIE--.

Col. 2, line 22, change "In" to --in--;
line 37, change "IRE" to --RIE--.

Col. 5, line 67, delete "is" (second occurrence).

Col. 7, line 36, change "In" to --in--.

Col. 12, line 2, change "GaAs" to --InGaAs--.

Signed and Sealed this

Third Day of March, 1998

Attest:

BRUCE LEHMAN

Attesting Officer     Commissioner of Patents and Trademarks